(12) United States Patent
Chen et al.

(10) Patent No.: US 11,494,542 B2
(45) Date of Patent: Nov. 8, 2022

(54) SEMICONDUCTOR DEVICE, METHOD OF GENERATING LAYOUT DIAGRAM AND SYSTEM FOR SAME

(71) Applicant: TAIWAN SEMICONDUCTOR MANUFACTURING COMPANY LTD., Hsinchu (TW)

(72) Inventors: Chung-Hui Chen, Hsinchu (TW); Tzu Ching Chang, Dali (TW); Wan-Te Chen, Danshui Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 247 days.

(21) Appl. No.: 16/741,440

(22) Filed: Jan. 13, 2020

(65) Prior Publication Data

US 2020/0242294 A1 Jul. 30, 2020

Related U.S. Application Data

(60) Provisional application No. 62/798,461, filed on Jan. 29, 2019.

(51) Int. Cl.
*G06F 30/392* (2020.01)
*H01L 23/522* (2006.01)
(Continued)

(52) U.S. Cl.
CPC ............ *G06F 30/392* (2020.01); *G03F 1/70* (2013.01); *G06F 30/398* (2020.01); *G06F 30/3953* (2020.01); *H01L 23/5226* (2013.01)

(58) Field of Classification Search
CPC .............. G06F 30/392; G06F 30/398; G06F 30/3953; G03F 1/70; H01L 23/5226
(Continued)

(56) References Cited

U.S. PATENT DOCUMENTS 8,520,348 B2   8/2013 Dong
9,325,310 B2   4/2016 Chen
(Continued)

FOREIGN PATENT DOCUMENTS

KR   20070078453   8/2007
KR   20120112797   10/2012
(Continued)

OTHER PUBLICATIONS

Office Action dated Nov. 9, 2020 for corresponding case No. TW 10-921079930. (pp. 1-11).
(Continued)

*Primary Examiner* — Tu-Tu V Ho
(74) *Attorney, Agent, or Firm* — Hauptman Ham, LLP

(57) ABSTRACT

A semiconductor device includes: an active area in a transistor layer; contact-source/drain (CSD) conductors in the transistor layer; gate conductors in the transistor layer, and interleaved with the CSD conductors; VG structures in the transistor layer, and over the active area; and a first gate-signal-carrying (GSC) conductor in an M_1st layer that is over the transistor layer, and that is over the active area; and wherein long axes correspondingly of the active area and the first GSC conductor extend substantially in a first direction; and long axes correspondingly of the CSD conductors and the gate conductors extend substantially in a second direction, the second direction being substantially perpendicular to the first direction.

20 Claims, 10 Drawing Sheets

(51) Int. Cl.
*G03F 1/70* (2012.01)
*G06F 30/3953* (2020.01)
*G06F 30/398* (2020.01)

(58) Field of Classification Search
USPC .......................................................... 257/401
See application file for complete search history.

(56) References Cited

U.S. PATENT DOCUMENTS

| | | | | |
|---|---|---|---|---|
| 9,613,953 | B2* | 4/2017 | Liaw | ................ H01L 29/66545 |
| 10,936,785 | B2* | 3/2021 | Biswas | ............... G03F 7/70433 |
| 2007/0160173 | A1 | 7/2007 | Takeuchi | |
| 2013/0207199 | A1 | 8/2013 | Becker et al. | |
| 2014/0110795 | A1 | 4/2014 | Oh et al. | |
| 2015/0236690 | A1 | 8/2015 | Chen | |
| 2016/0103942 | A1 | 4/2016 | Lin et al. | |
| 2017/0221818 | A1 | 8/2017 | Lau et al. | |
| 2018/0068050 | A1 | 3/2018 | Lin et al. | |
| 2018/0341736 | A1 | 11/2018 | Chen et al. | |

FOREIGN PATENT DOCUMENTS

| | | |
|---|---|---|
| KR | 20140052398 | 5/2014 |
| KR | 20160118448 | 10/2016 |
| KR | 20180028044 | 3/2018 |
| KR | 20180037765 | 4/2018 |
| TW | 201733065 | 9/2017 |
| TW | 201822320 | 6/2018 |
| TW | 201830659 | 8/2018 |
| WO | 2011093961 | 8/2011 |

OTHER PUBLICATIONS

Office Action dated May 20, 2021 for corresponding case No. DE 10 2020 100 755.8. (pp. 1-13).
Office Action dated Sep. 19, 2021 for corresponding case No. KR 10-2020-0010416. (pp. 1-7).
Office Action dated Jan. 20, 2021 for corresponding case No. KR 10-2020-0010416. (pp. 1-5).
Notice of Allowance dated Mar. 29, 2022 for corresponding case No. KR 10-2020-0010416. English translation attached on p. 1. (pp. 1-6).

* cited by examiner

SEMICONDUCTOR DEVICE, METHOD OF GENERATING LAYOUT DIAGRAM AND SYSTEM FOR SAME

PRIORITY CLAIM

The present application claims the priority of U.S. Provisional Application No. 62/798,461, filed Jan. 29, 2019, which is incorporated herein by reference in its entirety.

BACKGROUND

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization.

Typically, a set of design rules is specific to a process node by which will be fabricated a semiconductor device based on a layout diagram resulting. The design rule set compensates for variability of the corresponding process node. Such compensation increases the likelihood that an actual semiconductor device resulting from a layout diagram will be an acceptable counterpart to the virtual device on which the layout diagram is based.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
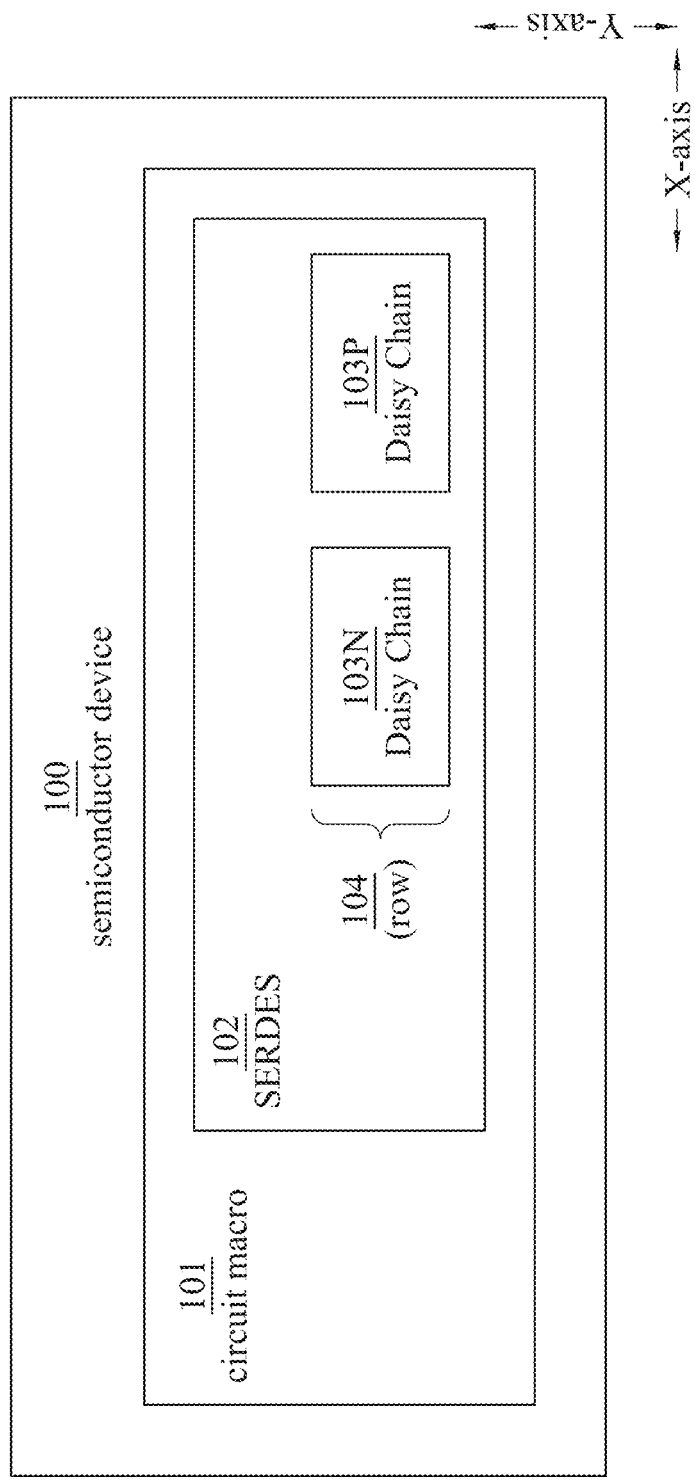
FIG. 1 is a block diagram of a semiconductor device, in accordance with at least one embodiment of the present disclosure.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a daisy chain arrangement of transistors is provided. In some embodiments, a daisy chain arrangement of transistors is a component included in a serializer/deserializer (SERDES) device. In some embodiments, the daisy chain arrangement of transistors includes fins representing an active region, gate structures over corresponding ones of the fins, via-on-gate (VG) structures over the gate structures AND over the active region, and a first gate-signal-carrying (GSC) conductor in a first layer of metallization (M_1st layer) (e.g., M0) and over the VG structures, where the GSC conductor in the M_1st layer (M_1st GSC conductor) is electrically coupled in common with each of the gate structures. According to another approach for making a daisy chain arrangement of transistors, a design rule prevented an M_1st GSC conductor from being located over the active region, which (among other things) increased a footprint of the daisy chain arrangement. For a given application of the daisy chain arrangement, use of the daisy chain arrangement according to the other approach results in speeds that are between ≈5.8% and ≈14.5% slower as compared to a daisy chain arrangement according to at least some embodiments. In some embodiments, to reduce capacitive coupling, a short axis of the M_1st GSC conductor is kept relatively narrow. In some embodiments in which the short axis of the M_1st GSC conductor is relatively narrow, to reduce resistance, a corresponding GSC conductor in an M_3rd layer (e.g., M2) is provided in parallel with the M_1st GSC conductor. In some embodiments, to reduce capacitive coupling, a short axis of the GSC conductor in the M_3rd layer (M_3rd GSC conductor) is kept relatively narrow. In some embodiments, the dimension of the short axis of the M_3rd GSC conductor is substantially the same as the dimension of the short axis of the M_1st GSC conductor.

In FIG. 1, semiconductor device 100A includes, among other things, a circuit macro (hereinafter, macro) 101A. Macro 101A includes, among other things, a serializer/deserializer (SERDES) device 102. General information regarding SERDES devices are found, e.g., in U.S. Pat. No. 9,325,310, granted Apr. 26, 2016, U.S. Pat. No. 8,520,348, granted Aug. 27, 2013, and U.S. Pre-Grant Publication No. 20070160173, published Jul. 12, 2007, the entireties of each of which are hereby incorporated by reference.

SERDES device 102 includes, among other things, a daisy chain arrangement 103N of transistors and a daisy chain arrangement 103P of transistors. In some embodiments, the transistors of daisy chain arrangement 103N are NMOS transistors and the transistors of daisy chain arrangement 103P are PMOS transistors. In some embodiments, SERDES 102 is arranged into rows extending substantially parallel to a first direction, and daisy chain arrangements 103N and 103P are both in a row 104. In FIG. 1, the first direction is the X-axis (horizontal). In some embodiments, the first direction is a direction other than the X-axis. In some embodiments, daisy chain arrangements 103N and 103P are in different rows. Examples of layout diagrams resulting in daisy chain arrangements 103N and/or 103P include the layout diagrams disclosed herein.

Figure 2A:
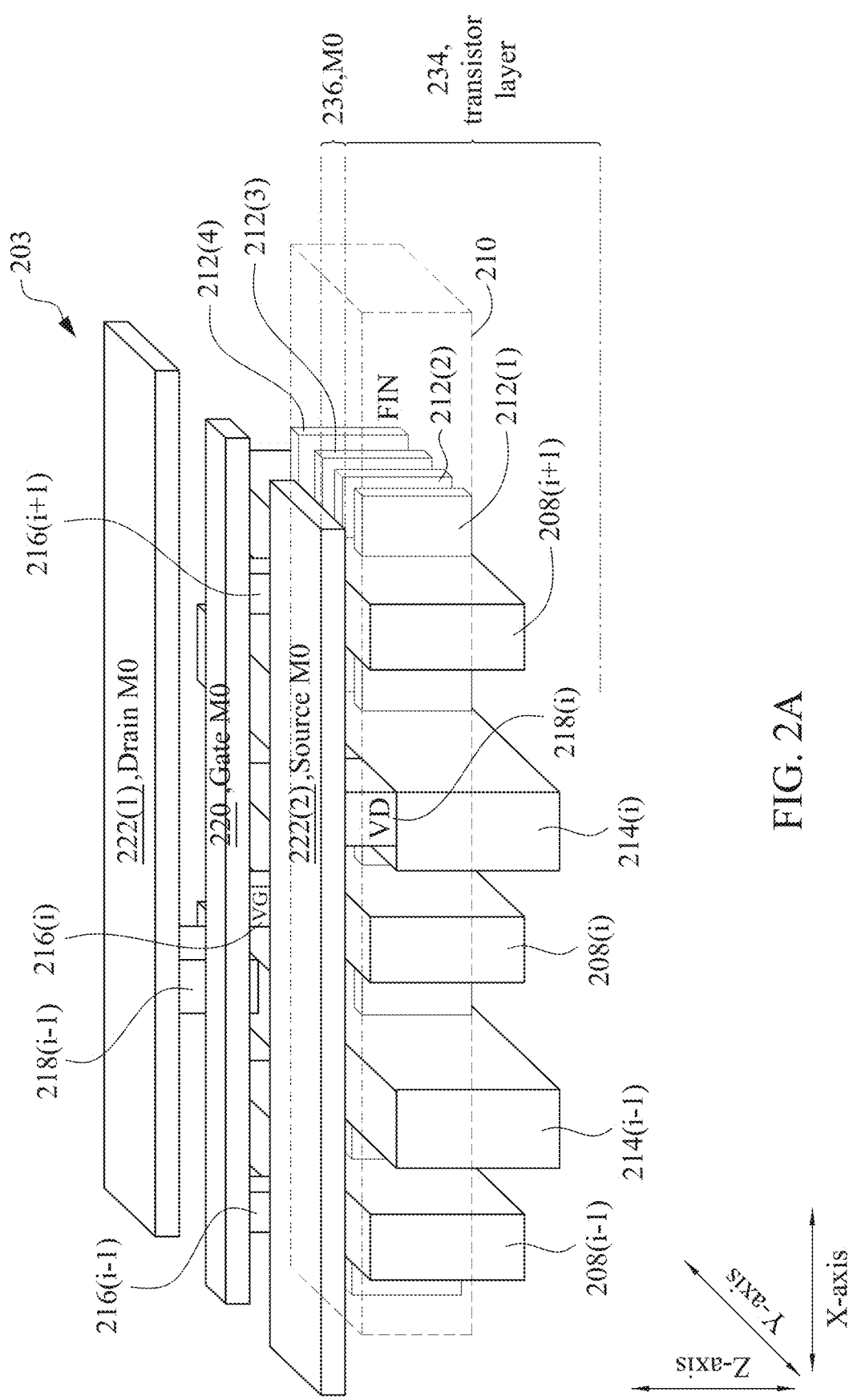
FIG. 2A is a three-dimensional view of a daisy chain arrangement in a semiconductor device, in accordance with some embodiments.

FIG. 2A is a three-dimensional view of a daisy chain arrangement 203 in a semiconductor device, in accordance with some embodiments.

Daisy chain arrangement 203 includes fins 212(1), 212(2), 212(3) and 212(4), corresponding long axes of which extend substantially parallel to a first direction. In FIG. 2A, the first direction is the X-axis (horizontal). In some embodiments, the first direction is a direction other than the X-axis. In some embodiments, daisy chain arrangement 203 includes a number of fins other than four. In FIG. 2A fins 212(1)-212(4) represent an active area (AA) structure 210 configured according to finFET transistor technology. In some embodiments, active area structure 210 is configured according to nano-wire. In some embodiments, active area 210 is configured according to nano-sheet transistor technology. In some embodiments, active area 210 is configured according to Gate-All-Around (GAA) transistor technology. In some embodiments, active area 210 is configured according to planar transistor technology.

In FIG. 2A, daisy chain arrangement 203 further includes gate structures 208($i$−1), 208($i$) and 208($i$+1), and contact-source/drain (CSD) structures 214($i$−1) and 214($i$), where i is a non-negative integer. Long axes of gate structures 208($i$−1), 208($i$) and 208($i$+1), and contact-source/drain (CSD) structures 214($i$−1) and 214($i$), extend substantially parallel to a second direction, the second direction being substantially perpendicular to the first direction. In FIG. 2A, the second direction is the Y-axis. In some embodiments, the first direction is a direction other than the Y-axis. Contact-source/drain (CSD) structures 214($i$−1) and 214($i$) are interleaved between corresponding ones of gate structures 208 ($i$−1), 208($i$) and 208($i$+1).

Daisy chain arrangement 203 further includes: via-on-gate (VG) structures 216($i$−1), 216($i$) and 216($i$+1) over corresponding gate structures 208($i$−1), 208($i$) and 208($i$+1); and via-on-CSD (VD) structures 218($i$−1) and 218($i$) over corresponding contact-source/drain (CSD) structures 214($i$−1) and 214($i$). Relative to the Y-axis, VG structures 216($i$−1), 216($i$) and 216($i$+1) are over active region 210. Relative to the Y-axis, VD structures 218($i$−1) and 218($i$) are not substantially over active region 210.

Relative to a third dimension which is perpendicular to each of the first and second directions, daisy chain arrangement 203 is organized into a stack including a transistor layer 234 and a first layer 236 of metallization (M_1 st layer 236). In some embodiments, the third direction is a direction other than the Z-axis. In transistor layer 234, among other things, transistors are formed. Transistor layer 234 includes: fins 212(1)-212(4); gate structures 208($i$−1), 208($i$) and 208($i$+1); contact-source/drain (CSD) structures 214($i$−1) and 214($i$); VG structures 216($i$−1), 216($i$) and 216($i$+1); and VD structures 218($i$−1) and 218($i$).

In FIG. 2A, Daisy chain arrangement 203 further includes conductors 220, 221(1) and 222(2) in M_1st layer 236. In some embodiments, depending upon the numbering convention of the corresponding process node by which daisy chain arrangement 203 is fabricated, the M_1st layer is either metallization layer zero, M0, or metallization layer one, M1. In FIG. 2A, as well as in FIGS. 3 and 4A-4B (discussed below), the M_1st layer is assumed to be M0.

More particularly, in FIG. 2A, conductor 220 is a gate-signal-carrying (GSC) conductor. GSC conductor 220 is over VG structures 216($i$−1), 216($i$) and 216($i$+1). As a result, gate structures 208($i$−1), 208($i$) and 208($i$+1) are electrically coupled together (or in common) by GSC conductor 220. Relative to the Y-axis, GSC conductor 220 is over active region 210.

Conductors 222(1) and 222(2) are source/drain-signal-carrying (SDC) conductors. In some embodiments, SDC conductor 222(1) is provided with a first reference voltage and SDC 222(2) is provided with a second reference voltage. In some embodiments, the first reference voltage is VDD and the second reference voltage is VSS. In some embodiments, the first reference voltage is a voltage other than VDD and the second reference voltage is a voltage other than VSS. Relative to the Y-axis, neither SDC conductor 222(1) nor SDC conductor 222(2) is substantially over active region 210. In some embodiments, one or both of SDC conductor 222(1) or 222(2) substantially overlaps active region 210.

In FIG. 2A, in some embodiments, to reduce capacitive coupling, relative to the Y-axis, a width of the short axis of GSC conductor 220 is relatively narrow. In some embodiments, to reduce capacitive coupling, relative to the Y-axis, a width of the short axis of GSC conductor 220 is substantially smaller than a width of a short axis of active region 210. In some embodiments, relative to the Y-axis, a width GSC conductor 220 ($W_{220}$) is a fraction of a width of active region 210 ($W_{210}$). In some embodiments, $W_{220} \approx (5/22)*W_{210}$.

In some embodiments, a width of the short axes of corresponding SDC conductors 222(1) and 222(2) ($W_{222}$) is significantly wider than the width of the short axis of GSC conductor 220, relative to the Y-axis. In some embodiments, $W_{220} \approx (2/3)*W_{222}$. In some embodiments, $W_{222}$ is a fraction of $W_{210}$. In some embodiments, $W_{222} \approx (15/44)*W_{210}$.

In FIG. 2A, daisy chain arrangement 203 further includes layers (not shown) of interlayer dielectric material which fill interstices between the various active components, e.g., fins 212(1)-212(4), gate structures 208($i$−1), 208($i$) and 208($i$+1); contact-source/drain (CSD) structures 214($i$−1) and 214($i$); VG structures 216($i$−1), 216($i$) and 216($i$+1); VD structures 218($i$−1) and 218($i$); GSC conductor 220; and SDC conductors 222(1) and 222(2)

Figure 2B:
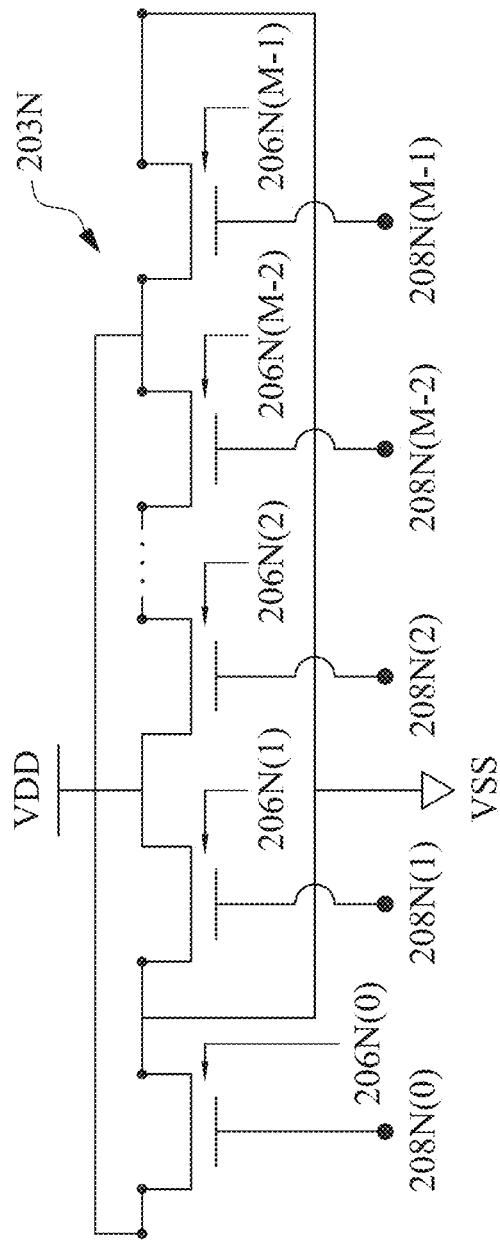
FIGS. 2B-2C are corresponding daisy chain circuit diagrams, in accordance with at least one embodiment of the present disclosure.
Figure 2C:
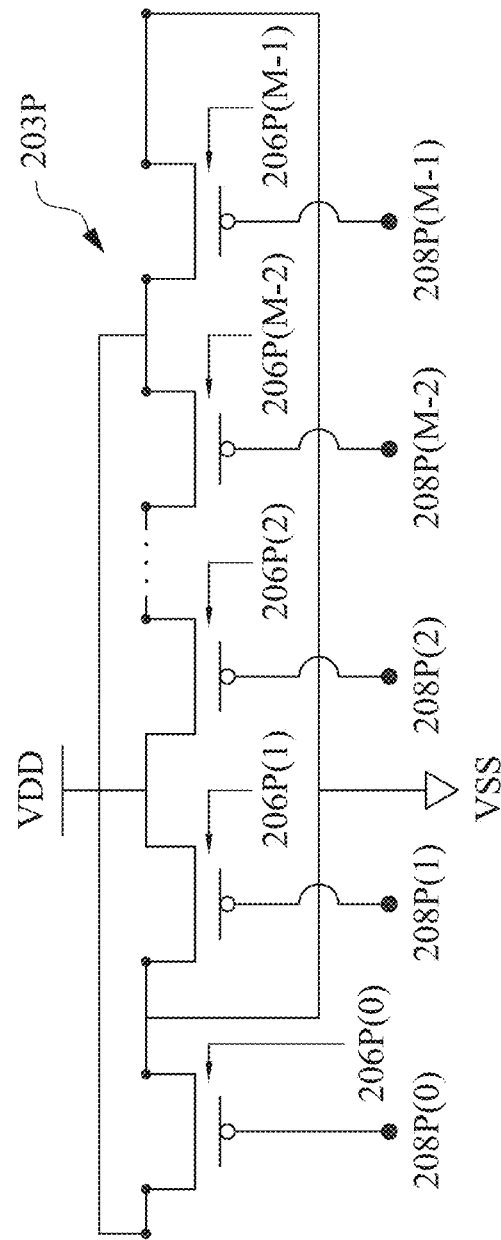

FIGS. 2B-2C are corresponding daisy chain circuit diagrams 203N and 203P, in accordance with at least one embodiment of the present disclosure.

Circuit diagrams 203N and 203P correspond to daisy chain arrangement 203 of FIG. 2A. More particularly, circuit diagram 203N corresponds to an embodiment in which the transistors of daisy chain arrangement 203 are NMOS transistors. Circuit diagram 203N includes NMOS transistors 206N(0), 206N(1), 206N(2), 206N(M−2) and 206N(M−1), and gate electrodes 208N(0), 208N(1), 208N(2), 208N(M−2) and 208N(M−1), where M is positive integer. In FIG. 2C, circuit diagram 203P corresponds to an embodiment in which the transistors of daisy chain arrangement 203 are PMOS transistors. Circuit diagram 203P includes PMOS transistors 206P(0), 206P(1), 206P(2), 206P(M−2) and 206P(M−1), and gate electrodes 208P(0), 208P(1), 208P(2), 208P(M−2) and 208P(M−1), where M is positive integer.

Figure 3:
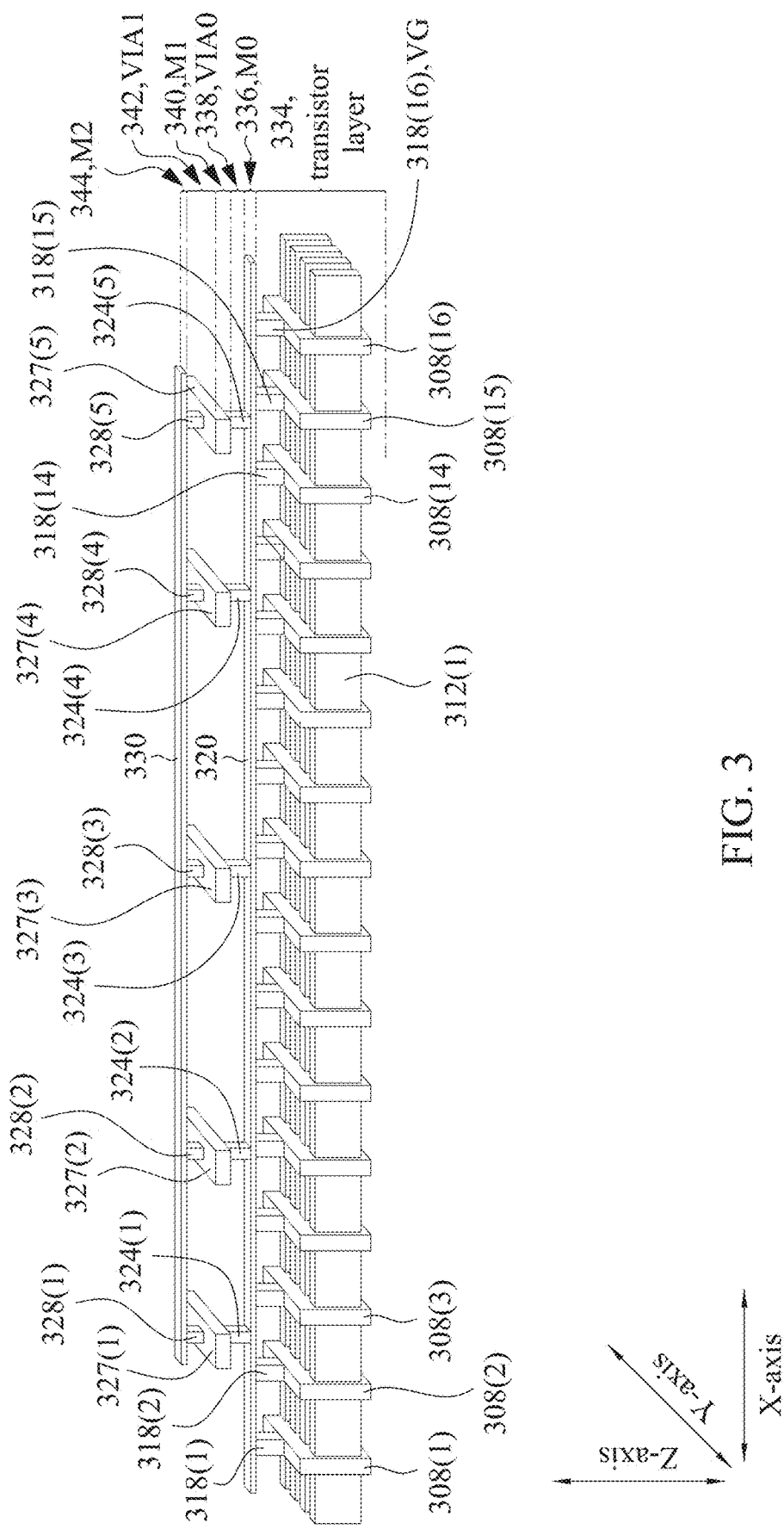
FIG. 3 is a three-dimensional view of a daisy chain arrangement in a semiconductor device, in accordance with some embodiments.

FIG. 3 is a three-dimensional view of a daisy chain arrangement 303 in a semiconductor device, in accordance with some embodiments.

FIG. 3 follows a similar numbering scheme to that of FIG. 2A. Though corresponding, some components also differ. To help identify components which correspond but nevertheless have differences, the numbering convention uses 3-series numbers for FIG. 3 while FIG. 2A uses 2-series numbers. For example, GSC conductor 320 in FIG. 3 corresponds to GSC conductor 220 in FIG. 2A, with similarities being reflected in the common root 20, and with the differences being reflected in the corresponding leading digit 3_(_) and 2_(_). For brevity, the discussion will focus more on differences between FIG. 3 and FIG. 2A than on similarities.

Daisy chain arrangement 303 includes gate structures 308(1), 308(2), 308(3), ... 308(14), 308(15) and 308(16), and thus includes 16 corresponding transistors. In some embodiments, numbers of gate electrodes, and this other numbers of transistors, is a number other than 16. Daisy chain arrangement 303 further includes VG structures 318(1), 318(2), ... 318(14), 318(15) and 318(16).

Relative to the third dimension, which is the Z-axis in FIG. 3, daisy chain arrangement 303 is organized into a stack including: a transistor layer 234, an M_1st layer 336; a first layer 338 of interconnection structures (VIA_1st 338); a second layer 340 of metallization (M_2nd layer 340); a second layer 342 of interconnection structures (VIA_2nd 342); and a third layer 344 of metallization (M_3rd layer 344). In FIG. 3, M_1st layer 336 is M0, and accordingly VIA_1st layer 338 is VIA0, M_2nd layer 340 is M1, VIA_2nd layer 342 is VIA1 and M_3rd layer 344 is M2.

In FIG. 3, M0 layer 336 includes conductor 320, which is a gate-signal-carrying (GSC) conductor. Via structures in VIA0 layer 338 are referred to as V0 structures. Daisy chain arrangement 303 further includes V0 structures 324(1), 324(2), 324(3) 324(4) and 324(5).

In FIG. 3, M1 layer 340 includes conductors 327(1), 327(2), 327(3) 327(4) and 327(5), each of which is a GSC conductor. In some embodiments, the number of M1 GSC conductors is a number other than 5. GSC conductors 327(1)-327(5) are correspondingly aligned over V0 structures 324(1), 324(2), 324(3) 324(4) and 324(5). Via structures in VIA1 layer 342 are referred to as V1 structures. Daisy chain arrangement 303 further includes V1 structures 328(1), 328(2), 328(3) 328(4) and 328(5). V1 structures 328(1)-328(5) are correspondingly aligned over V0 structures 324(1)-324(5). In FIG. 3, M2 layer 344 includes conductor 330, which is GSC conductor.

In FIG. 3, in some embodiments, to reduce capacitive coupling, a dimension of the short axis of M1 GSC conductor 320 is relatively narrow, relative to the Y-axis.

In some embodiments in which the short axis of M1 GSC 320 conductor is relatively narrow, to reduce resistance, a dimension of the short axis of M2 GSC conductor 330 is relatively narrow, relative to the Y-axis. In some embodiments, the dimension of the short axis of the M2 GSC conductor 330 is substantially the same as the dimension of the short axis of M0 GSC conductor 320.

Figure 4A:
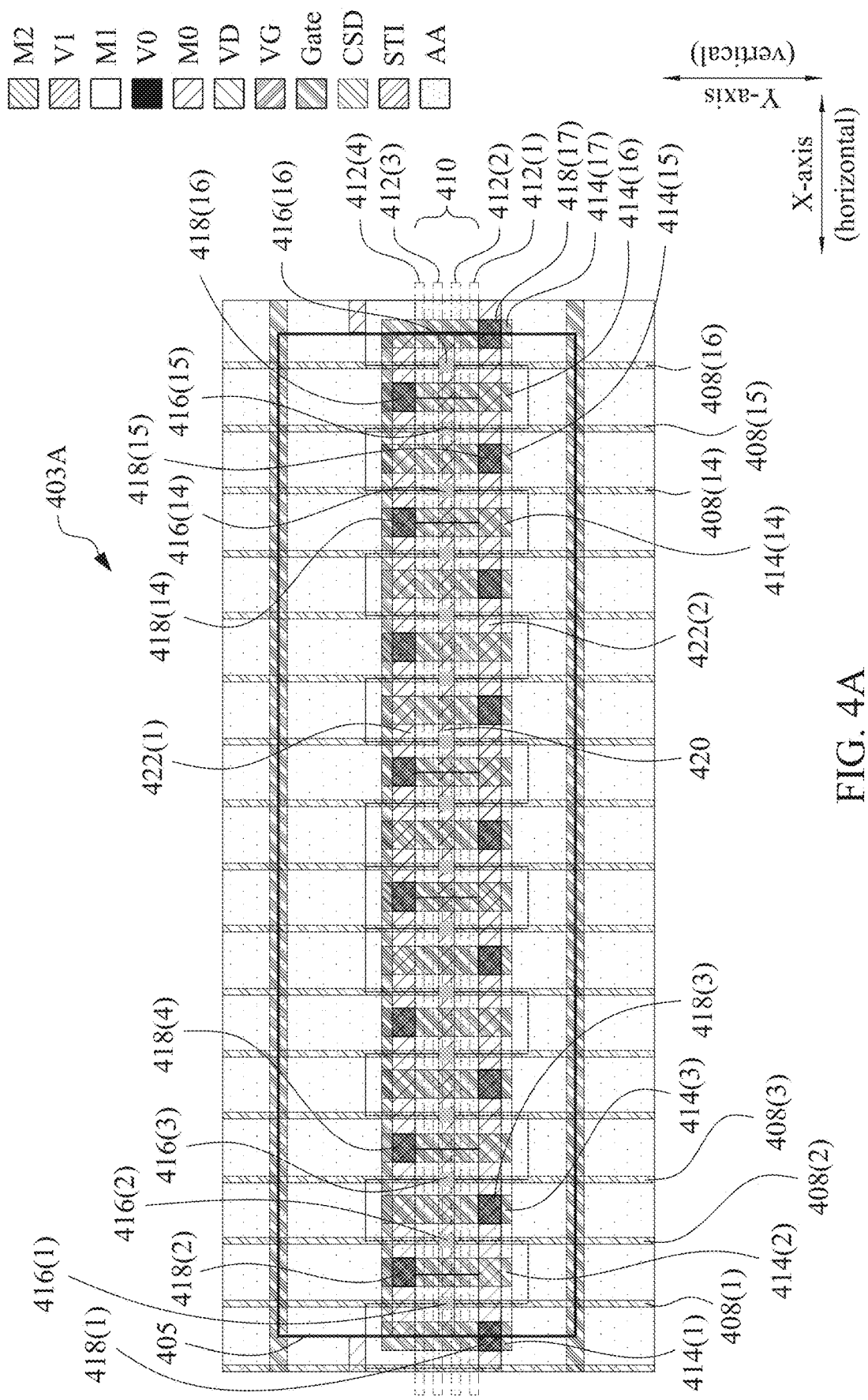
FIGS. 4A-4B are corresponding layout diagrams, in accordance with some embodiments.
Figure 4B:
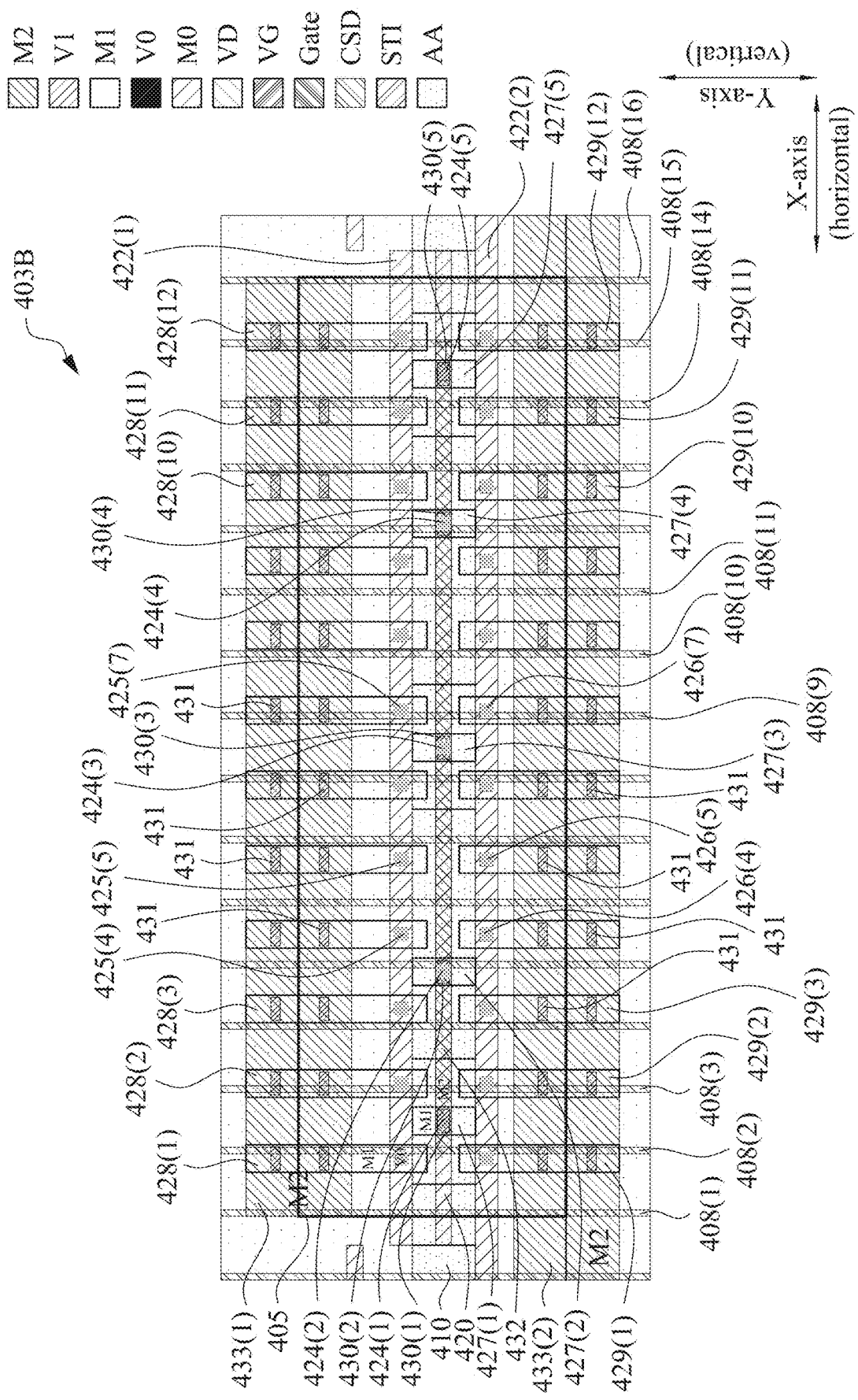

FIGS. 4A-4B are corresponding layout diagrams of daisy chain cells 403A-403B, in accordance with some embodiments.

FIGS. 4A-4B follow a similar numbering scheme to that of FIG. 3. Though corresponding, some components also differ. To help identify components which correspond but nevertheless have differences, the numbering convention uses 4-series numbers for FIGS. 4A-4B while FIG. 3 uses 3-series numbers. For example, M0 GSC pattern 420 in FIGS. 4A-4B corresponds to GSC conductor 320 in FIG. 3, with similarities being reflected in the common root_20, and with the differences being reflected in the corresponding leading digit 4_(_) and 3_(_). For brevity, the discussion will focus more on differences between FIGS. 4A-4B and FIG. 3 than on similarities.

Daisy chain cells 403A and 403B represent the same daisy chain arrangement. Daisy chain cell 403A shows patterns from the transistor level to the M0 level. Daisy chain cell 403B shows patterns from the M0 level to the M2 level. In addition, daisy chain cell 403B shows active area pattern 410 and gate patterns 408(1)-408(16) from the transistor level.

In FIG. 4A, daisy chain cell 403A includes gate patterns 408(1), 408(2), 408(3), ... 408(14), 408(15) and 408(16), and thus provides patterns representing 16 corresponding transistors. In some embodiments, the number of gate patterns, and thus the number of represented transistors, is a number other than 16. In some embodiments, relative to the X-axis, a pitch between gate patterns (gate pitch, $P_{gate}$) is a multiple of a width of a gate pattern ($W_{gate}$), where $W_{gate}$ is determined by the design rules and scale of the corresponding semiconductor process technology node. In some embodiments, relative to the X-axis, $P_{gate} \approx (85/6) * W_{gate}$.

Daisy chain cell 403A further includes: contact-source/drain (CSD) patterns 414(1), 414(2), 414(3), ..., 414(17); VG patterns 416(1), 416(2), 416(3), ..., 416(14), 416(15) and 416(16); and VD patterns 418(1), 418(2), 418(3), 418(4), ... 418(14), 418(15), 418(16) and 418(17). In some embodiments, relative to the X-axis, a width of each of CSD patterns 414(1)-414(17) ($W_{CSD}$) is a multiple of $W_{gate}$. In some embodiments, relative to the X-axis, $W_{CSD} \approx 5 * W_{gate}$.

In FIG. 4A, daisy chain cell 403A has a boundary 405. In some embodiments, relative to the Y-axis, a height of daisy chain cell 403A ($H_{CELL}$) is a multiple of $W_{gate}$. In some embodiments, relative to the Y-axis, $H_{CELL} \approx 70 * W_{gate}$.

Relative to the Y-axis, VG patterns 416(1)-416(16) are over active area pattern 410. Relative to the Y-axis, M0 GSC pattern 420 is over VG patterns 416(1)-416(16), and thus M0 GSC pattern 420 is over active area pattern 410. In some embodiments, active area pattern 410 is represented by fin patterns 412(1), 412(2), 412(3) and 412(4).

Relative to the Y-axis, M0 SDC patterns 422(1) and 422(2) are on opposite sides of M0 GSC pattern 420. Relative to the Y-axis, VD patterns 418(2), 418(4), ... 418(14) and 418(16) are on the same side of M0 GSC pattern 420 as M0 SDC pattern 422(1). Relative to the Y-axis, VD patterns 418(1), 418(3), ... 418(15) and 418(17) are on the same side of M0 GSC pattern 420 as M0 SDC pattern 422(2).

Relative to the Y-axis, neither M0 SDC pattern 422(1) nor M0 SDC pattern 422(2) is substantially over active area pattern 410. In some embodiments, one or both of M0 SDC pattern 422(1) or 422(2) substantially overlaps active area pattern 410. In the example of FIG. 4A, relative to the X-axis, it is assumed that VD pattern 418(1) is shared with another cell (not shown) which abuts a left side of daisy chain cell 430, and VD pattern 418(17) is shared with another cell (not shown) which abuts a right side of daisy chain cell 430.

In some embodiments, to reduce capacitive coupling, relative to the Y-axis, a width of the short axis of M0 GSC pattern 420 is substantially smaller than a width of a short axis of active area pattern 410. In some embodiments, relative to the Y-axis, a width M0 GSC pattern 420 ($W_{420}$) is a fraction of a width of active area pattern 410 ($W_{410}$). In some embodiments, $W_{420} \approx (5/22)*W_{410}$. In some embodiments, $W_{420}$ is a fraction of a width of the short axes of corresponding M0 SDC patterns 422(1) and 422(2) ($W_{422}$). In some embodiments, $W_{420} \approx (2/3)*W_{422}$. In some embodiments, $W_{422}$ is a fraction of $W_{410}$. In some embodiments, relative to the Y-axis, $W_{422} \approx (15/44)*W_{410}$.

In FIG. 4A, in some embodiments, relative to the Y-axis, a width of M0 GSC pattern 420 ($W_{420}$) is a multiple of $W_{gate}$. In some embodiments, $W_{420} \approx (20/6)*W_{gate}$. In some embodiments, relative to the Y-axis, a width of each of M0 SDC patterns 422(1)-422(2) ($W_{422}$) is a multiple of $W_{gate}$. In some embodiments, $W_{422} \approx 5*W_{gate}$. In some embodiments, relative to the Y-axis, a width of a gap between M0 GSC pattern 420 and each of M0 SDC patterns 422(1)-422 (2) ($W_{M0gapGSCSDC}$) is a multiple of $W_{gate}$. In some embodiments, relative to the Y-axis, $W_{M0gapGSCSDC} \approx (34/6)*W_{gate}$.

In FIG. 4B, daisy chain cell 403B includes: V0 patterns 424(1), 424(2), 424(3), 424(4) and 424(5); V0 patterns 425(1), 425(2), . . . , 425(5), 425(6), 425(7), . . . , 425(11) and 425(12); V0 patterns 426(1), 426(2), . . . , 426(5), 426(6), 426(7), . . . , 426(11) and 426(12); M1 GSC patterns 427(1), 427(2), 427(3), 427(4) and 427(5); M1 SDC patterns 428(1), 428(2), 428(3), . . . , 428(10), 428(11) and 428(12); M1 SDC patterns 429(1), 429(2), 429(3), . . . , 429(10), 429(11) and 429(12); V1 patterns 430(1), 430(2), 430(3), 430(4) and 430(5); V1 patterns 431; M2 GSC pattern 432; and M2 SDC patterns 433(1) and 433(2).

In some embodiments, relative to the X-axis, a width of each of M1 GSC patterns 427(1)-427(5) ($W_{M1GSC}$) is a multiple of $W_{gate}$. In some embodiments, relative to the X-axis, $W_{M1GSC} \approx (37/6)*W_{gate}$. In some embodiments, relative to the X-axis, a width of each of M1 SDC patterns 428(1)-428(12) and 429(1)-429(12) ($W_{M1SDC}$) is a multiple of $W_{gate}$. In some embodiments, relative to the X-axis, $W_{M1SDC} \approx (37/6)*W_{gate}$.

In some embodiments, relative to the X-axis, a pitch between M1 SDC patterns 428(1)-428(12) and 429(1)-429(12) ($P_{M1SDC}$) is a multiple of a width of $W_{gate}$. In some embodiments, relative to the X-axis, $P_{M1SDC} \approx 17*W_{gate}$. In some embodiments, relative to the X-axis, a gap between corresponding ones of M1 SDC patterns 428(1)-428(12) and 429(1)-429(12) ($W_{M1gapSDCSDC}$) is a multiple of $W_{gate}$. In some embodiments, relative to the Y-axis, $W_{M1gapSDCSDC} \approx (65/6)*W_{gate}$.

V0 patterns 424(1)-424(5) are aligned over M0 GSC pattern 420. In some embodiments, the number of V0 patterns aligned over M0 GSC pattern 420 is a number other than five. V0 patterns 425(1)-425(12) are aligned over M0 SDC pattern 422(1). V0 patterns 426(1)-426(12) are aligned over M0 SDC pattern 422(2).

M1 GSC patterns 427(1)-427(5) are aligned over corresponding V0 patterns 424(1)-424(5). M1 SDC patterns 428(1)-428(12) are aligned over corresponding V0 patterns 425(1)-425(12). M1 SDC patterns 429(1)-429(12) are aligned over corresponding V0 patterns 426(1)-426(12). V1 patterns 430(1)-430(5) are over corresponding M1 GSC patterns 427(1)-427(5). V1 patterns 431 are over corresponding M1 SDC patterns 428(1)-428(12) and 429(1)-429 (12).

M2 GSC pattern 432 is over V1 patterns 430(1)-430(5). M2 SDC pattern 433(1) is over corresponding V1 patterns 431 and over M1 SC patterns 428(1)-428(12). M2 SDC pattern 433(2) is over corresponding V1 patterns 431 and over M1 SC patterns 429(1)-429(12).

In FIG. 4B, in some embodiments, relative to the Y-axis, a width of M2 GSC pattern 432 ($W_{433}$) is a multiple of $W_{gate}$. In some embodiments, relative to the Y-axis, $W_{433} \approx (20/6)*W_{gate}$. In some embodiments, $W_{432} \approx W_{420}$. In some embodiments, relative to the Y-axis, a width of each of M2 SDC patterns 433(1)-433(2) ($W_{433}$) is a multiple of $W_{gate}$. In some embodiments, relative to the X-axis, $W_{433} \approx (140/6)*W_{gate}$. In some embodiments, $W_{433} \approx (14/3)*W_{422}$.

Relative to the X-direction, at least some but not all of M1 SDC patterns 428(1)-428(12) and 429(1)-429(12) are between corresponding ones of gate patterns 408(1)-408(16). In the particular example of daisy chain cell 403B, M1 SDC patterns 428(3) and 429(3) are between gate patterns 408(4) and 408(5), M1 SDC patterns 428(4) and 429(4) are between gate patterns 408(5) and 408(6), M1 SDC patterns 428(8) and 429(8) are between gate patterns 408(10) and 408(11), M1 SDC patterns 428(9) and 429(9) are between gate patterns 408(11) and 408(12), and M1 SDC patterns 428(10) and 429(10) are between gate patterns 408(12) and 408(13).

In FIG. 4B, relative to the X-direction, at least some of M1 SDC patterns 428(1)-428(12) and 429(1)-429(12) are over corresponding ones of gate patterns 408(1)-408(16). In the particular example of daisy chain cell 403B, M1 SDC patterns 428(1) and 429(1) are over gate pattern 408(2), M1 SDC patterns 428(2) and 429(2) are over gate pattern 408(3), M1 SDC patterns 428(6) and 429(6) are over gate pattern 408(8), M1 SDC patterns 428(7) and 429(7) are over gate pattern 408(9), M1 SDC patterns 428(11) and 429(11) are over gate pattern 408(14), M1 SDC patterns 428(12) and 429(12) are over gate pattern 408(15). According to another approach for making a daisy chain arrangement of transistors, a design rule prevented an M1 SDC pattern from overlapping a gate pattern relative to the X-axis. A benefit of having at least some of M1 SDC patterns 428(1)-428(12) and 429(1)-429(12) over corresponding ones of gate patterns 408(1)-408(16), according to some embodiments, relative to the X-axis, is that a width of daisy chain cell 403B is smaller than a width of a daisy chain cell according to the other approach, resulting in faster operating speeds, higher operation frequency and/or lower power consumption. In some embodiments, a daisy chain arrangement based on daisy chain cells 403A-403B has an approximately 20% higher unity gain frequency. In some embodiments, a daisy chain arrangement based on daisy chain cells 403A-403B has an approximately 15% higher effective gain margin. As compared to that daisy chain cell according to the other approach, a further benefit of using daisy chain cell 403B in SERDES device 102 is that the size of a SERDES device 102 is reduced, resulting in faster operating speeds and/or lower power consumption.

Another benefit of having at least some of M1 SDC patterns 428(1)-428(12) and 429(1)-429(12) over corresponding ones of gate patterns 408(1)-408(16), according to some embodiments, relative to the X-axis, is that a pitch between gate patterns (gate pitch, $P_{gate}$) is larger than the gate pitch according to the other approach. In the example of FIG. 4B, a width of daisy chain cell 403B is $16P_{gate}$.

In FIG. 4B, relative the Y-axis, M0 GSC pattern 420 is disposed between M0 SDC pattern 422(1) and M0 SDC pattern 422(2). Accordingly, relative to the Y-axis, a gap between M0 SDC patterns 422(1) and 422(2) is larger than would result from another approach for making a daisy chain arrangement of transistors. According to the other approach, M0_1st (here, M0) SDC patterns were substantially over the active region, but a design rule prevented an M0 GSC conductor from being located over the active region. Relative to M1 tracks running substantially parallel to the Y-axis, if a first M1 SDC pattern designated for VDD and a second M1 SDC pattern designated for VSS according to the other approach would have been located on the same M1 track, then ends of the first and second M1 SDC tracks overlying the active region would have been too close together relative to the Y-axis, which would have violated a minimum end-to-end spacing design rule. To avoid violating the minimum end-to-end spacing design rule, the smaller gap between M1 SDC patterns according to the other approach prevented the first and second M1 SDC patterns from being located on the same M1 track, resulting more generally in M1 SDC patterns having to be located on different M1 tracks.

By contrast, in FIG. 4B, relative to the X-axis, a benefit of the larger gap resulting from having M0 GSC pattern 420 disposed between M0 SDC pattern 422(1) and M0 SDC pattern 422(2), according to some embodiments, is that M1 SDC patterns 428(1)-428(12) are aligned with corresponding M1 SDC patterns 429(1)-429(12). For example, M1 SDC pattern 428(1) is aligned with M1 SDC pattern 429(1) relative to a corresponding M1 track (not shown), M1 SDC pattern 428(2) is aligned with M1 SDC pattern 429(2) relative to a corresponding M1 track (not shown), M1 SDC pattern 428(3) is aligned with M1 SDC pattern 429(3) relative to a corresponding M1 track (not shown), . . . , M1 SDC pattern 428(10) is aligned with M1 SDC pattern 429(10) relative to a corresponding M1 track (not shown), M1 SDC pattern 428(11) is aligned with M1 SDC pattern 429(11) relative to a corresponding M1 track (not shown), and M1 SDC pattern 428(12) is aligned with M1 SDC pattern 429(12) relative to a corresponding M1 track (not shown). The larger gap facilitates avoiding violation of a minimum end-to-end spacing design rule by ends of corresponding pairs M1 SDC patterns 428(1)-428(12) and M1 SDC patterns 429(1)-429(12). A benefit of having M1 SDC patterns 428(1)-428(12) aligned with corresponding M1 SDC patterns 429(1)-429(12), according to some embodiments, relative to the X-axis, is that a width of daisy chain cell 403B is smaller than a width of a daisy chain cell according to the other approach, resulting in faster operating speeds and/or lower power consumption. As compared to that daisy chain cell according to the other approach, a further benefit of using daisy chain cell 403B in SERDES device 102 is that the size of a SERDES device 102 is reduced, resulting in faster operating speeds and/or lower power consumption. Alternatively, relative to the X-axis, for given size of SERDES device, a benefit of having M1 SDC patterns 428(1)-428(12) aligned with corresponding M1 SDC patterns 429(1)-429(12) is that the width of each of M1 SDC patterns 428(1)-428(12) aligned with corresponding M1 SDC patterns 429(1)-429(12) is increased which decreases resistance, resulting in faster operating speeds and/or lower power consumption.

Figure 5:
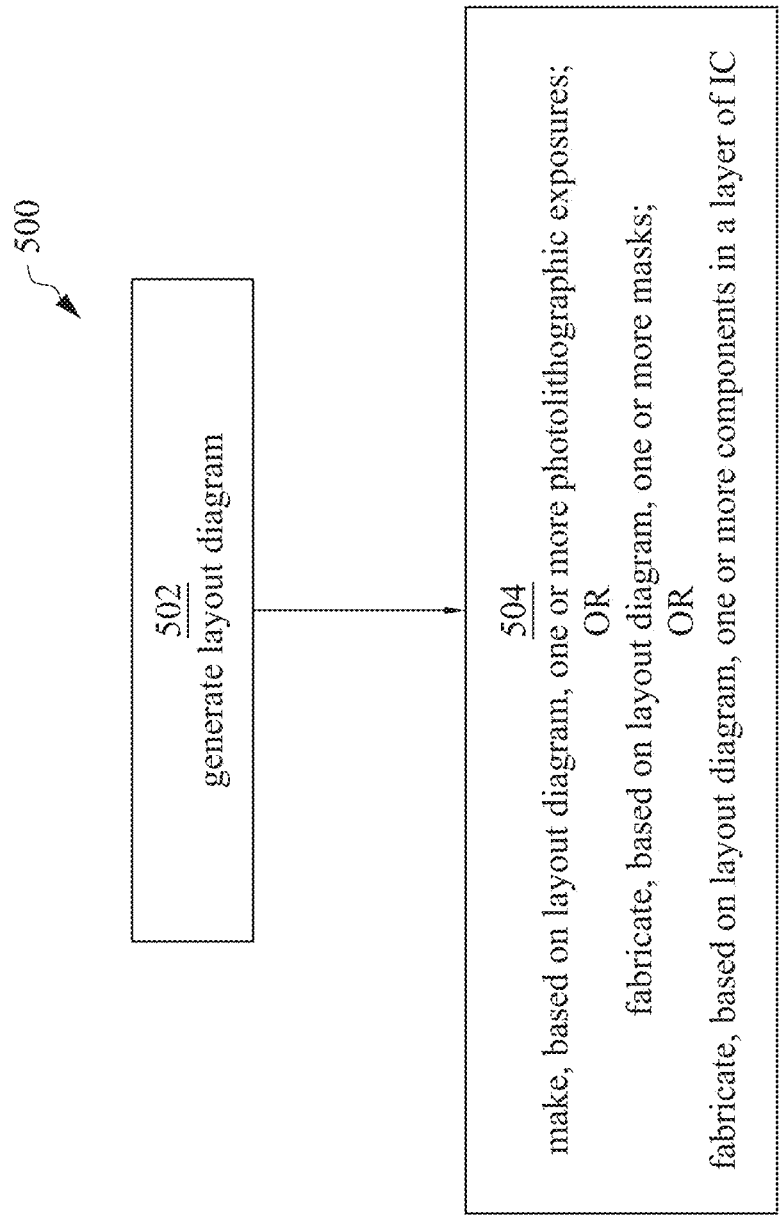
FIG. 5 is a flowchart of a method of manufacturing a semiconductor device, in accordance with some embodiments.

FIG. 5 is a flowchart of a method 500 of generating a layout diagram, in accordance with some embodiments.

Method 500 is implementable, for example, using EDA system 700 (FIG. 7, discussed below) and an integrated circuit (IC), manufacturing system 800 (FIG. 8, discussed below), in accordance with some embodiments. Regarding method 500, examples of the layout diagram include layout diagrams 200A-200H and 200I(1) of corresponding FIGS. 2A-2H and 2I(1). Examples of a semiconductor device which can be manufactured according to method 500 include semiconductor device 100 FIG. 1.

In FIG. 5, method 500 includes blocks 502-504. At block 502, a layout diagram is generated which, among other things, includes a daisy chain cell as in, e.g., FIGS. 4A-4B. An example of a semiconductor device corresponding to a layout generated by method 500 includes semiconductor device 100 of FIG. 1. Block 502 is discussed in more detail below with respect to FIG. 6. From block 502, flow proceeds to block 504.

At block 504, based on the layout diagram, at least one of (A) one or more photolithographic exposures are made or (B) one or more semiconductor masks are fabricated or (C) one or more components in a layer of a semiconductor device are fabricated. See discussion below of FIG. 8.

Figure 6:
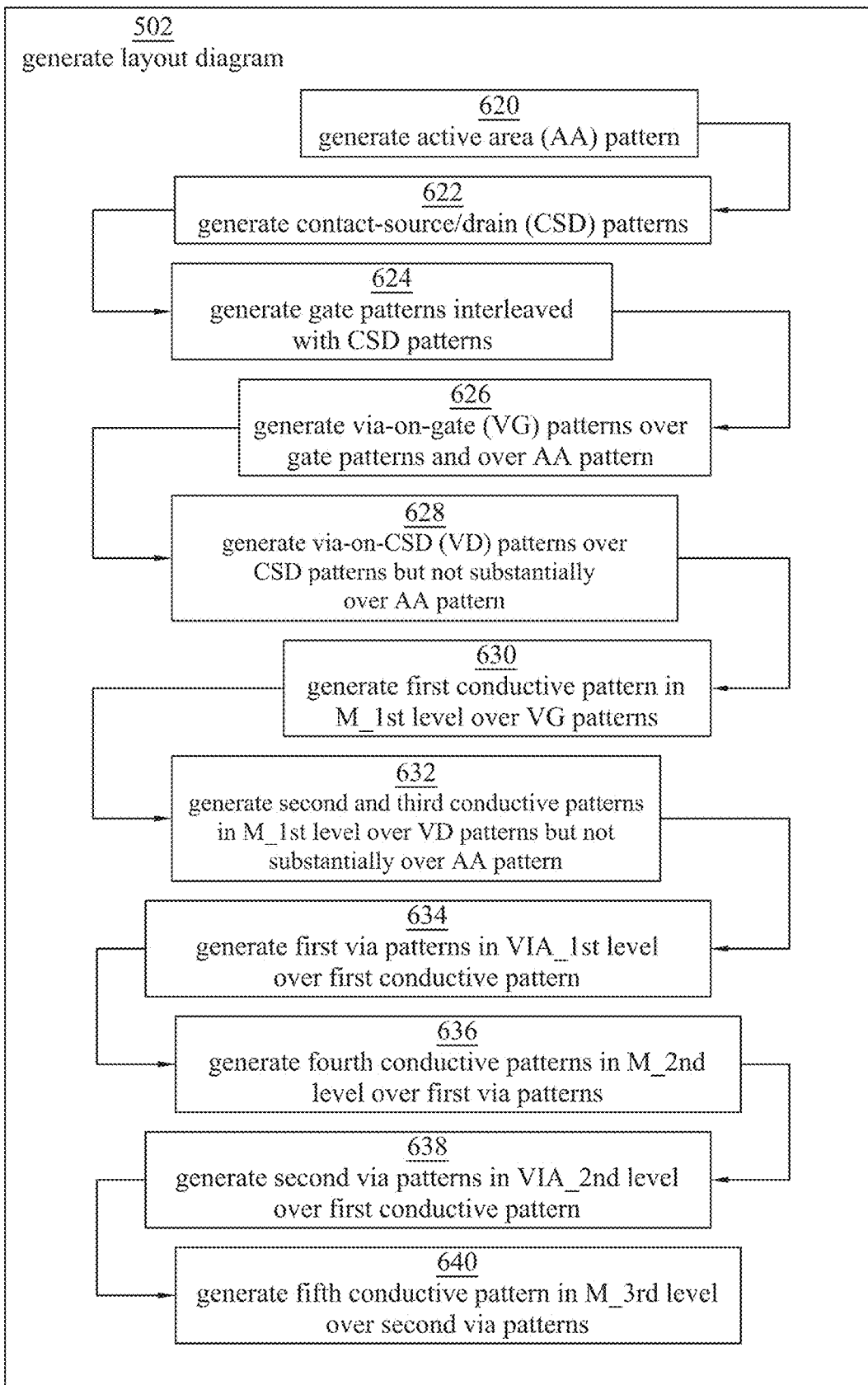
FIG. 6 is a flowchart of a method of generating a layout diagram, in accordance with some embodiments.

FIG. 6 is a flowchart of a method of generating a layout diagram, in accordance with some embodiments.

More particularly, the flowchart of FIG. 6 shows additional blocks included in block 502 of FIG. 5, in accordance with one or more embodiments.

Block 502 is implementable, for example, using EDA system 700 (FIG. 7, discussed below), in accordance with some embodiments. Regarding block 502, examples of the layout diagrams which are generated according to block 502 include the layout diagrams of FIGS. 4A-4B, or the like. Examples of a semiconductor device which can be manufactured based on layout diagrams generated according to block 502 include semiconductor device 100 FIG. 1, and semiconductor devices based on the layout diagrams of FIGS. 4A-4B, or the like.

In FIG. 6, block 502 includes blocks 620-640. At block 620, an active area (AA) pattern is generated. A long axis of the AA pattern extends substantially in a first direction. An example of an active area pattern is active area pattern 410 in FIG. 4A, or fin patterns 412(1), 412(2), 412(3) and 412(4) in FIG. 4A. From block 620, flow proceeds to block 622.

At block 622, contact-source/drain (CSD) patterns are generated. Long axes of the CSD patterns extend substantially in a second direction, where the second direction is substantially perpendicular to the first direction. Examples of the CSD patterns include CSD patterns 422(1) and 422(2) in FIG. 4A. From block 622, flow proceeds to block 624.

At block 624, gate patterns are generated which are interleaved with the CSD patterns. Long axes of the gate patterns extend substantially in the second direction. Examples of the gate patterns include gate patterns 408(1)-408(16) of FIG. 4A. From block 624, flow proceeds to block 626.

At block 626, via-on-gate (VG) patterns are generated over the corresponding gate patterns, and over the active area pattern. Examples of the VG patterns include VG patterns 416(1)-416(16) in FIG. 4A. From block 626, flow proceeds to block 628.

At block 628, via-on-CSD (VD) patterns are generated over corresponding CSD patterns but substantially not over the active area pattern. Examples of VD patterns include VD patterns 418(1)-418(17) in FIG. 4A. From block 628, flow proceeds to block 630.

At block 630, a first conductive pattern in the M_1st level is generated over the VG patterns. A long axis of the first conductive pattern in the M_1st level extends substantially in the first direction. An example of the first conductive pattern in the M_1st level is M0 GSC pattern 420 in FIG. 4A. In some embodiments, relative to the second direction, a length of a short axis of the first conductive pattern is sized to be substantially smaller than a length of a short axis of the active area pattern. For example, in FIG. 4A, relative to the Y-axis, a width of M0 GSC pattern 420 is substantially smaller than a width of active area pattern 410. From block 630, flow proceeds to block 632.

At block 632, second and third conductive patterns in the M_1st level over corresponding ones of the VD patterns are generated. Long axes of the corresponding second and third conductive patterns in the M_1st level extend substantially in the first direction. Examples of the second and third conductive patterns in the M_1st level include corresponding M0 SDC patterns 422(1) and 422(2). In some embodiments, relative to the second direction, a length of a short axis of at least one of the second or third conductive pattern is sized to be substantially smaller than the same as a length of a short axis of the active area pattern. For example, in FIG. 4B, relative to the Y-axis, a width of each of M0 SDC patterns 422(1) and 422(2) is substantially smaller than a width of active area pattern 410. From block 632, flow proceeds to block 634.

At block 634, first via patterns in the VIA_1st level are generated over the first conductive pattern in the M_1st level. Examples of the first via patterns in the VIA_1st level include V0 patterns 424(1)-424(5) in FIG. 4B. In some embodiments, alpha and beta via patterns are generated in the VIA_1st level and correspondingly over the second and third conductive patterns. Examples of the alpha via patterns include V0 patterns 425(1)-425(1). Examples of the beta via patterns include V0 patterns 426(1)-426(12). From block 634, flow proceeds to block 636.

At block 636, fourth conductive patterns in the M_2nd level are generated over the corresponding first via patterns in the VIA_1st level, as well as over the first conductive pattern in the M_1st level. Long axes of the fourth conductive patterns in the M_2nd level extend substantially in the second direction. Examples of the fourth conductive patterns in the M_2nd level include M1 GSC patterns 427(1)-427(5).

In some embodiments, alpha conductive patterns and beta conductive patterns are generated in the M_2nd level and correspondingly over the alpha and beta via patterns, as well as correspondingly over the first conductive pattern. Long axes of the alpha and beta patterns extend substantially in the second direction. Examples of the alpha conductive patterns in the M_2nd level include M1 SDC patterns 428(1)-428(5). Examples of the beta conductive patterns in the M_2nd level include M1 SDC patterns 429(1)-429(5).

In some embodiments, relative to the first direction, at least some of the gate patterns are overlapped by corresponding ones of the alpha and beta conductive patterns. For example, in the particular example of FIG. 4B, M1 SDC patterns 428(1) and 429(1) are over gate pattern 408(2), M1 SDC patterns 428(2) and 429(2) are over gate pattern 408(3), M1 SDC patterns 428(6) and 429(6) are over gate pattern 408(8), M1 SDC patterns 428(7) and 429(7) are over gate pattern 408(9), M1 SDC patterns 428(11) and 429(11) are over gate pattern 408(14), M1 SDC patterns 428(12) and 429(12) are over gate pattern 408(15).

In some embodiments, at least some of the gate patterns (4xx) are not overlapped by corresponding ones of the alpha and beta conductive patterns. For example, in the particular example of FIG. 4B, M1 SDC patterns 428(3) and 429(3) are between gate patterns 408(4) and 408(5), M1 SDC patterns 428(4) and 429(4) are between gate patterns 408(5) and 408(6), M1 SDC patterns 428(8) and 429(8) are between gate patterns 408(10) and 408(11), M1 SDC patterns 428(9) and 429(9) are between gate patterns 408(11) and 408(12), and M1 SDC patterns 428(10) and 429(10) are between gate patterns 408(12) and 408(13). From block 636, flow proceeds to block 638.

At block 638, second via patterns in the VIA_2nd level are generated over the fourth conductive patterns in the M_2nd level. Examples of the second via patterns in the VIA_2nd level include V1 patterns 430(1)-430(5). From block 638, flow proceeds to block 640.

At block 640, a fifth conductive pattern in the M_3rd level is generated over the second via patterns in the VIA_2nd level. An example of the fifth conductive pattern in the M_3rd level is M2 GSC pattern 432.

Figure 7:
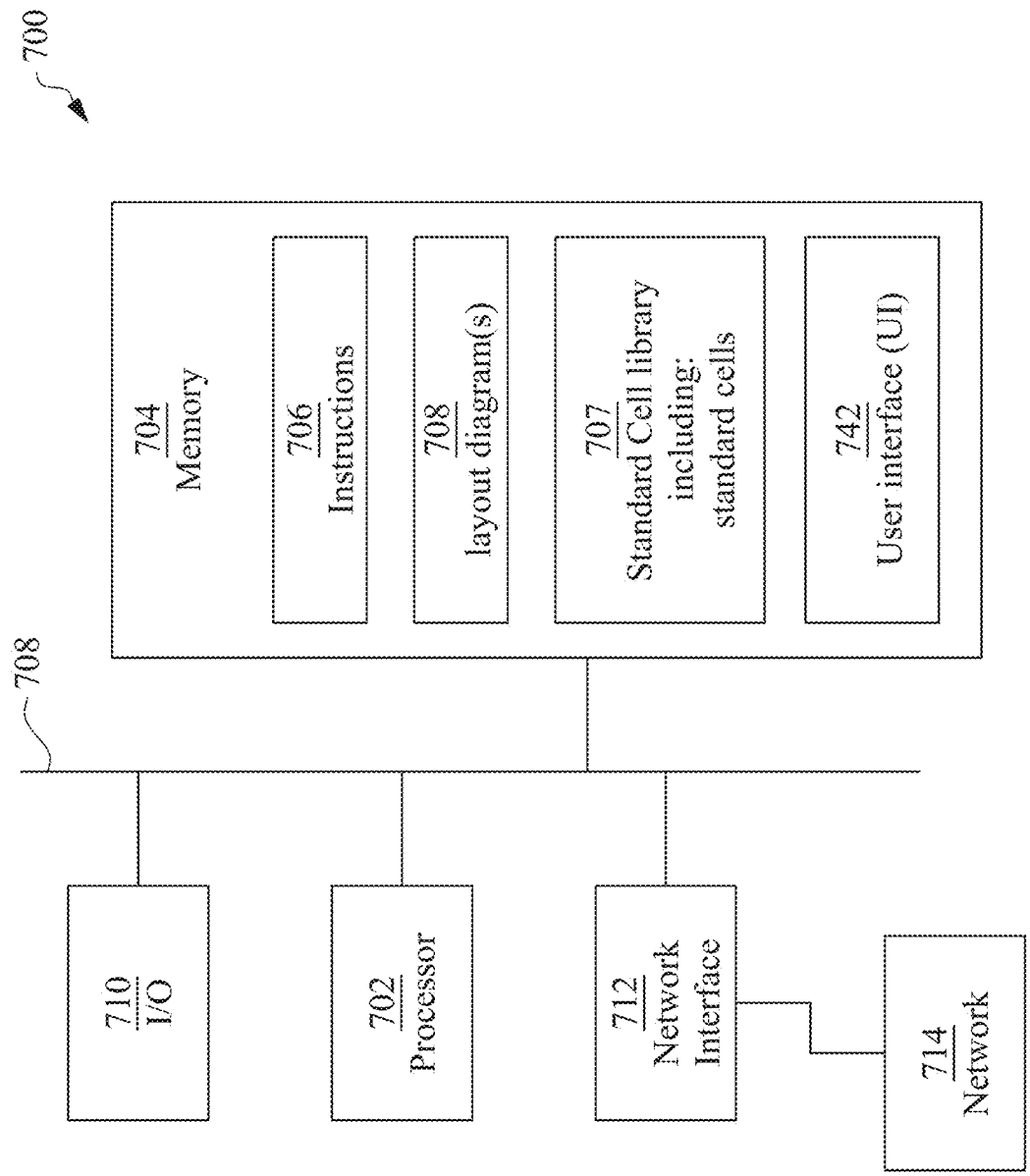
FIG. 7 is a block diagram of an electronic design automation (EDA) system in accordance with some embodiments.

FIG. 7 is a block diagram of an electronic design automation (EDA) EDA system 700 in accordance with some embodiments.

In some embodiments, EDA system 700 includes an APR system. Methods described herein of designing layout diagrams represent wire routing arrangements, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, where computer program code 706 is a set of computer-executable instructions. Execution of computer program code 706 by processor 702 represents (at least in part) an EDA tool which implements a portion or all of, e.g., the methods described herein in accordance with one or more corresponding embodiments (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause EDA system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause EDA system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells corresponding to cells disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows EDA system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

EDA system 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
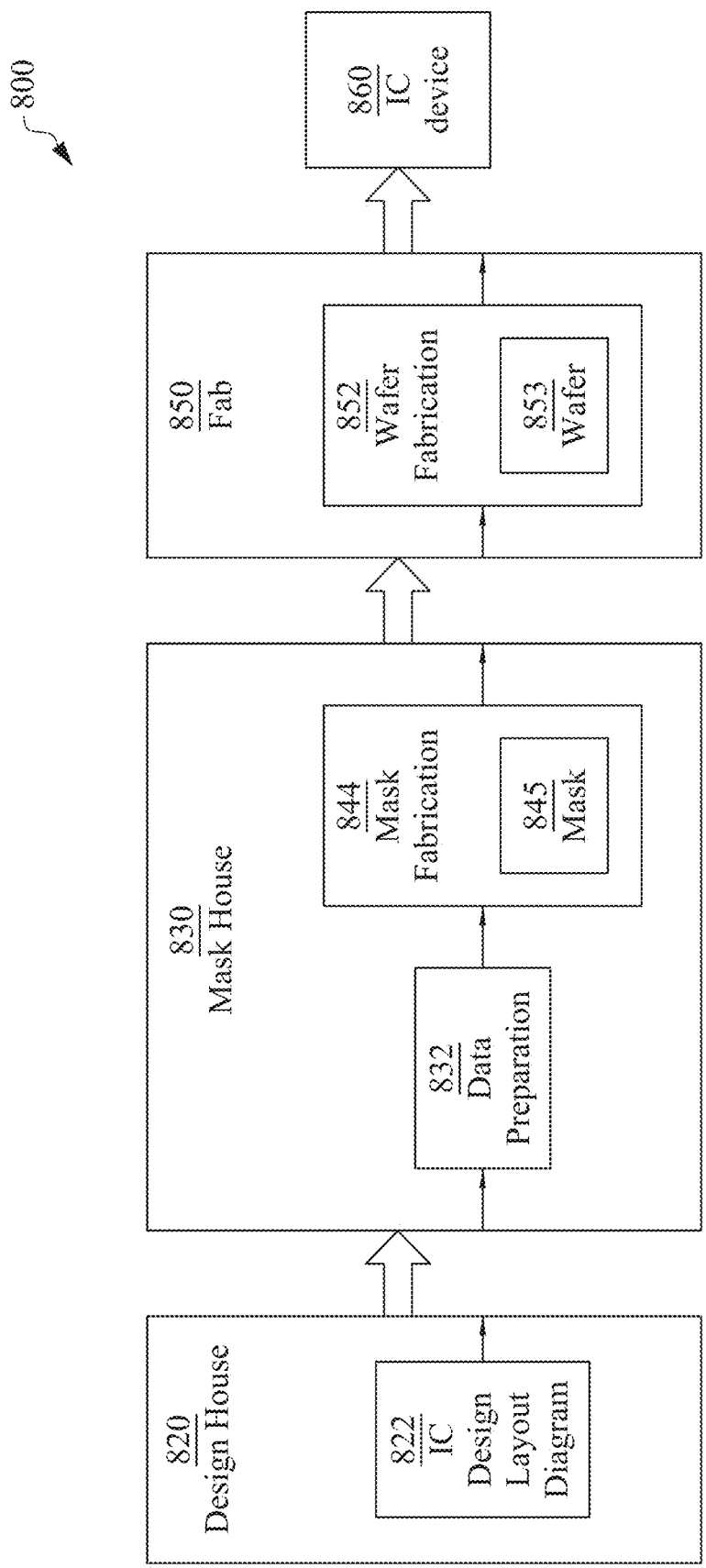
FIG. 8 is a block diagram of a semiconductor device manufacturing system, and an IC manufacturing flow associated therewith, in accordance with some embodiments.

FIG. 8 is a block diagram of semiconductor device, e.g., an integrated circuit (IC), manufacturing system 800, and an IC manufacturing flow associated therewith, in accordance with some embodiments.

In some embodiments, based on a layout diagram, e.g., one or more of the layout diagrams disclosed herein in accordance with one or more corresponding embodiments, or the like, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

In an embodiment, a method of manufacturing a semiconductor device (for a layout diagram stored on a non-transitory computer-readable medium) includes generating the layout diagram which itself includes: generating an active area pattern representing a corresponding active area in the semiconductor device; generating contact-source/drain (C S D) patterns over the active area pattern, the CSD patterns representing corresponding CSD conductors in the semiconductor device; generating gate patterns interleaved with corresponding ones of the CSD patterns, and over the active area pattern, the gate patterns representing corresponding gate conductors in the semiconductor device; generating via-on-gate (VG) patterns correspondingly over the gate patterns as well as over the active area pattern, the VG patterns representing corresponding VG structures in the semiconductor device; and generating a first conductive pattern correspondingly over the VG patterns, and over the CSD patterns and the gate patterns, as well as over the active area pattern, the first conductive pattern representing a first gate-signal-carrying (GSC) conductor in a first layer of metallization (M_1st layer) of the semiconductor device; and wherein long axes correspondingly of the active area pattern and the first conductive pattern extend substantially in a first direction; and long axes correspondingly of the CSD patterns and the gate patterns extend substantially in a second direction, the second direction being substantially perpendicular to the first direction. In an embodiment, the method further includes, based on the layout diagram, at least one of: (A) making one or more photolithographic exposure; (B) fabricating one or more semiconductor masks; or (C) fabricating at least one component in a layer of a semiconductor integrated circuit. In an embodiment, the generating the layout diagram further includes: relative to the second direction, sizing a length of a short axis of the first conductive pattern to be substantially smaller than a length of a short axis of the active area pattern. In an embodiment, the generating the layout diagram further includes: generating via-on-CSD (VD) patterns correspondingly over the CSD patterns, but not substantially over the active area pattern, the VD patterns representing corresponding VD structures in the semiconductor device; and generating second and third conductive patterns correspondingly over the VD patterns, but not substantially over the active area pattern, the second and third conductive patterns representing corresponding first and second source/drain-signal-carrying (SDC) conductors in the semiconductor device; and wherein long axes correspondingly of the second and third conductive patterns extend substantially in the first direction. In an embodiment, the generating the layout diagram further includes relative to the second direction, at least one of: sizing a length of a short axis of at least one of the second or third conductive pattern to be substantially greater than a length of a short axis of the first conductive pattern; or sizing a length of a short axis of at least one of the second or third conductive pattern to be substantially smaller than a length of the short axis of the active area pattern. In an embodiment, the generating the layout diagram further includes: generating first via patterns correspondingly over the first conductive pattern, the first via patterns representing corresponding first via structures in a first layer of interconnection (VIA_1st layer) of the semiconductor device; generating second conductive patterns correspondingly over the first via patterns, as well as correspondingly over the first conductive pattern, the second conductive patterns representing GSC conductors in a second layer of metallization (M_2nd layer) of the semiconductor device; and long axes correspondingly of the second conductive patterns extend substantially in the second direction. In an embodiment, the generating the layout diagram further includes: generating alpha and beta via patterns correspondingly over the second and third conductive patterns, the alpha and beta via patterns representing corresponding alpha and beta via structures in the VIA_1st layer; and generating alpha and beta conductive patterns correspondingly over the first via patterns, as well as correspondingly over the alpha and beta via patterns, the alpha and beta conductive patterns representing corresponding alpha and beta SDC conductors in the M_2nd layer; and wherein long axes correspondingly of the alpha and beta conductive patterns extend substantially in the second direction; and relative to the first direction, at least some of the gate patterns are overlapped by corresponding ones of the alpha and beta conductive patterns. In an embodiment, relative to the first direction, at least some of the gate patterns are not overlapped by corresponding ones of the alpha and beta conductive patterns. In an embodiment, the generating the layout diagram further includes: generating second via patterns correspondingly over the first conductive pattern and the second conductive patterns, as well as correspondingly over the first via patterns, the second via patterns representing corresponding second via structures in a second layer of interconnection (VIA_2nd layer) of the semiconductor device; generating a third conductive pattern over the second via patterns, as well as correspondingly over the first conductive pattern, the third conductive pattern representing a GSC conductor in a third layer of metallization (M_3rd layer) of the semiconductor device; and a long axis of the third conductive pattern extends substantially in the first direction.

In an embodiment, a system for manufacturing a semiconductor device, the system includes at least one processor and at least one memory including computer program code for one or more programs; wherein (for a layout diagram stored on a non-transitory computer-readable medium) the at least one memory, the computer program code and the at least one processor are configured to cause the system to execute a method which includes generating the layout diagram including: generating an active area pattern representing a corresponding active area in the semiconductor device; generating contact-source/drain (C S D) patterns over the active area pattern, the CSD patterns representing corresponding CSD conductors in the semiconductor device; generating gate patterns interleaved with corresponding ones of the CSD patterns, and over the active area pattern, the gate patterns representing corresponding gate conductors in the semiconductor device; generating via-on-gate (VG) patterns correspondingly over the gate patterns as well as over the active area pattern, the VG patterns representing corresponding VG structures in the semiconductor device; generating a first conductive pattern correspondingly over the VG patterns, over the CSD patterns and the gate patterns, as well as over the active area pattern, the first conductive pattern representing a first gate-signal-carrying (GSC) conductor in a first layer of metallization (M_1 st layer) of the semiconductor device; generating first via patterns correspondingly over the first conductive pattern, the first via patterns representing corresponding first via structures in a first layer of interconnection (VIA_1st layer) of the semiconductor device; and generating second conductive patterns over the first via patterns, and correspondingly over the first conductive pattern, as well as correspondingly over the first conductive pattern, the second conductive patterns representing second GSC conductors in a second layer of metallization (M_2nd layer) of the semiconductor device; and wherein long axes correspondingly of the active area pattern and the first conductive pattern extend substantially in a first direction; and long axes correspondingly of the C S D patterns, the gate patterns and the second conductive patterns extend substantially in a second direction, the second direction being substantially perpendicular to the first direction.

In an embodiment, the system further includes at least one of: a masking facility configured to fabricate one or more semiconductor masks based on based on the layout diagram; or a fabricating facility configured to fabricate at least one component in a layer of a semiconductor integrated circuit based on the layout diagram. In an embodiment, the generating the layout diagram further includes: relative to the second direction, sizing a length of a short axis of the first conductive pattern to be substantially smaller than a length of a short axis of the active area pattern. In an embodiment, the generating the layout diagram further includes: generating via-on-CSD (VD) patterns correspondingly over the CSD patterns, but not substantially over the active area pattern, the VD patterns representing corresponding VD structures in the semiconductor device; and generating third and fourth conductive patterns correspondingly over the VD patterns, but not substantially over the active area pattern, the third and fourth conductive patterns representing corresponding first and second source/drain-signal-carrying (SDC) conductors in the semiconductor device; and wherein long axes correspondingly of the second and third conductive patterns extend substantially in the first direction. In an embodiment, relative to the first direction, at least some of the gate patterns are overlapped by corresponding ones of the second conductive patterns. In an embodiment, the generating the layout diagram further includes: generating second via patterns correspondingly over the first conductive pattern, as well as correspondingly over the first via patterns, the second via patterns representing corresponding second via structures in a second layer of interconnection (VIA_2nd layer) of the semiconductor device; generating a fifth conductive pattern over the second via patterns, as well as correspondingly over the first conductive pattern, the fifth conductive patterns representing a third GSC conductor in a third layer of metallization (M_3rd layer) of the semiconductor device; and a long axis of the third conductive pattern extends substantially in the first direction.

In an embodiment, a semiconductor device includes: an active area in a transistor layer; contact-source/drain (CSD) conductors in the transistor layer and over and electrically coupled with the active area; gate conductors in the transistor layer, over and electrically coupled with the active area, and interleaved with corresponding ones of the CSD conductors; VG structures in the transistor layer, and correspondingly over and electrically coupled with the gate patterns, as well as over the active area; and a first gate-signal-carrying (GSC) conductor in an M_1st layer that is over the transistor layer, the first GSC conductor being correspondingly over and electrically coupled with the VG structures, and being over the CSD conductors and the gate conductors, as well as over the active area; and wherein: long axes correspondingly of the active area and the first GSC conductor extend substantially in a first direction; and long axes correspondingly of the CSD conductors and the gate conductors extend substantially in a second direction, the second direction being substantially perpendicular to the first direction. In an embodiment, the semiconductor device further includes: first via structures in the a first layer of interconnection (VIA_1st layer), and correspondingly over the first GSC conductor; second GSC conductors in a second layer of metallization (M_2nd layer), and correspondingly over the first via structures, as well as correspondingly over the first GSC conductor; and long axes correspondingly of the second GSC conductors extend substantially in the second direction. In an embodiment, relative to the first direction, at least some of the gate conductors are overlapped by corresponding ones of the second GSC conductors. In an embodiment, second via structures in a second layer of interconnection (VIA_2nd layer), and correspondingly over the second GSC conductors, as well as correspondingly over the first via structures; a third GSC conductor in a third layer of metallization (M_3rd layer), and over the second via structures, as well as correspondingly over the first GSC conductor; and a long axis of the third GSC conductor extends substantially in the first direction. In an embodiment, the semiconductor device is included in a serializer/deserializer (SERDES) device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, for a layout diagram stored on a non-transitory computer-readable medium, the method comprising generating the layout diagram including:

generating an active area pattern representing a corresponding active area in the semiconductor device;

generating contact-source/drain (CSD) patterns over the active area pattern, the CSD patterns representing corresponding CSD conductors in the semiconductor device;

generating gate patterns interleaved with corresponding ones of the CSD patterns, and over the active area pattern, the gate patterns representing corresponding gate conductors in the semiconductor device;

generating via-on-gate (VG) patterns correspondingly over the gate patterns as well as over the active area pattern, the VG patterns representing corresponding VG structures in the semiconductor device; and generating a first conductive pattern correspondingly over the VG patterns, and over the CSD patterns and the gate patterns, as well as over the active area pattern, the first conductive pattern representing a first gate-signal-carrying (GSC) conductor in a first layer of metallization (M_1st layer) of the semiconductor device; and wherein:

long axes correspondingly of the active area pattern and the first conductive pattern extend substantially in a first direction; and long axes correspondingly of the CSD patterns and the gate patterns extend substantially in a second direction, the second direction being substantially perpendicular to the first direction.

2. The method of claim 1, further comprising:

based on the layout diagram, at least one of:

(A) making one or more photolithographic exposure;

(B) fabricating one or more semiconductor masks; or (C) fabricating at least one component in a layer of a semiconductor integrated circuit.

3. The method of claim 1, wherein the generating the layout diagram further includes:

relative to the second direction, sizing a length of a short axis of the first conductive pattern to be substantially smaller than a length of a short axis of the active area pattern.

4. The method of claim 1, wherein the generating the layout diagram further includes:

generating via-on-CSD (VD) patterns correspondingly over the CSD patterns, but not substantially over the active area pattern, the VD patterns representing corresponding VD structures in the semiconductor device; and generating second and third conductive patterns correspondingly over the VD patterns, but not substantially over the active area pattern, the second and third conductive patterns representing corresponding first and second source/drain-signal-carrying (SDC) conductors in the semiconductor device; and wherein long axes correspondingly of the second and third conductive patterns extend substantially in the first direction.

5. The method of claim 4, wherein the generating the layout diagram further includes:

relative to the second direction, at least one of:
sizing a length of a short axis of at least one of the second or third conductive pattern to be substantially greater than a length of a short axis of the first conductive pattern; or
sizing a length of a short axis of at least one of the second or third conductive pattern to be substantially smaller than a length of the short axis of the active area pattern.

6. The method of claim 1, wherein:

the generating the layout diagram further includes:
generating first via patterns correspondingly over the first conductive pattern, the first via patterns representing corresponding first via structures in a first layer of interconnection (VIA_1st layer) of the semiconductor device;
generating second and third conductive patterns correspondingly over the first via patterns, as well as correspondingly over the first conductive pattern, the second conductive patterns representing GSC conductors in a second layer of metallization (M_2nd layer) of the semiconductor device; and
long axes correspondingly of the second conductive patterns extend substantially in the second direction.

7. The method of claim 6, wherein:

the generating the layout diagram further includes:
generating alpha and beta via patterns correspondingly over the second and third conductive patterns, the alpha and beta via patterns representing corresponding alpha and beta via structures in the VIA_1st layer; and
generating alpha and beta conductive patterns correspondingly over the first via patterns, as well as correspondingly over the alpha and beta via patterns, the alpha and beta conductive patterns representing corresponding alpha and beta SDC conductors in the M_2nd layer;
long axes correspondingly of the alpha and beta conductive patterns extend substantially in the second direction; and
relative to the first direction, at least some of the gate patterns are overlapped by corresponding ones of the alpha and beta conductive patterns.

8. The method of claim 7, wherein:

relative to the first direction, at least some of the gate patterns are not overlapped by corresponding ones of the alpha and beta conductive patterns.

9. The method of claim 6, wherein:

the generating the layout diagram further includes:
generating second via patterns correspondingly over the first conductive pattern, as well as correspondingly over the first via patterns and the second conductive patterns, the second via patterns representing corresponding second via structures in a second layer of interconnection (VIA_2nd layer) of the semiconductor device;

generating a third conductive pattern over the second via patterns, as well as correspondingly over the first conductive pattern, the third conductive pattern representing a GSC conductor in a third layer of metallization (M_3rd layer) of the semiconductor device; and a long axis of the third conductive pattern extends substantially in the first direction.

10. A system for manufacturing a semiconductor device, the system comprising:

at least one processor; and
at least one memory including computer program code for one or more programs;
wherein, for a layout diagram stored on a non-transitory computer-readable medium, the at least one memory, the computer program code and the at least one processor are configured to cause the system to execute a method which includes generating the layout diagram including:
generating an active area pattern representing a corresponding active area in the semiconductor device;
generating contact-source/drain (CSD) patterns over the active area pattern, the CSD patterns representing corresponding CSD conductors in the semiconductor device;
generating gate patterns interleaved with corresponding ones of the CSD patterns, and over the active area pattern, the gate patterns representing corresponding gate conductors in the semiconductor device;
generating via-on-gate (VG) patterns correspondingly over the gate patterns as well as over the active area pattern, the VG patterns representing corresponding VG structures in the semiconductor device;
generating a first conductive pattern correspondingly over the VG patterns, over the CSD patterns and the gate patterns, as well as over the active area pattern, the first conductive pattern representing a first gate-signal-carrying (GSC) conductor in a first layer of metallization (M_1st layer) of the semiconductor device;
generating first via patterns correspondingly over the first conductive pattern, the first via patterns representing corresponding first via structures in a first layer of interconnection (VIA_1st layer) of the semiconductor device; and
generating second and third conductive patterns over the first via patterns, and correspondingly over the first conductive pattern, as well as correspondingly over the first conductive pattern, the second conductive patterns representing second GSC conductors in a second layer of metallization (M_2nd layer) of the semiconductor device; and
wherein:
long axes correspondingly of the active area pattern and the first conductive pattern extend substantially in a first direction; and
long axes correspondingly of the CSD patterns, the gate patterns and the second conductive patterns extend substantially in a second direction, the second direction being substantially perpendicular to the first direction.

11. The system of claim 10, further comprising at least one of:

a masking facility configured to fabricate one or more semiconductor masks based on based on the layout diagram; or a fabricating facility configured to fabricate at least one component in a layer of a semiconductor integrated circuit based on the layout diagram.

12. The system of claim 10, wherein the generating the layout diagram further includes:
relative to the second direction, sizing a length of a short axis of the first conductive pattern to be substantially smaller than a length of a short axis of the active area pattern.

13. The system of claim 10, wherein the generating the layout diagram further includes:
generating via-on-CSD (VD) patterns correspondingly over the CSD patterns, but not substantially over the active area pattern, the VD patterns representing corresponding VD structures in the semiconductor device; and
generating second and third conductive patterns correspondingly over the VD patterns, but not substantially over the active area pattern, the second and third conductive patterns representing corresponding first and second source/drain-signal-carrying (SDC) conductors in the semiconductor device; and
wherein long axes correspondingly of the second and third conductive patterns extend substantially in the first direction.

14. The system of claim 10, wherein:
relative to the first direction, at least some of the gate patterns are overlapped by corresponding ones of the second conductive patterns.

15. The system of claim 10, wherein:
the generating the layout diagram further includes:
generating second via patterns correspondingly over the first conductive pattern, as well as correspondingly over the first via patterns, the second via patterns representing corresponding second via structures in a second layer of interconnection (VIA_2nd layer) of the semiconductor device;
generating a fifth conductive pattern over the second via patterns, as well as correspondingly over the first conductive pattern, the fifth conductive patterns representing a third GSC conductor in a third layer of metallization (M_3rd layer); and
a long axis of the third conductive pattern extends substantially in the first direction.

16. A semiconductor device comprising:
an active area in a transistor layer;
contact-source/drain (CSD) conductors in the transistor layer and over and electrically coupled with the active area;
gate conductors in the transistor layer, over and electrically coupled with the active area, and interleaved with corresponding ones of the CSD conductors;
VG structures in the transistor layer, and correspondingly over and electrically coupled with the gate conductors, as well as over the active area; and
a first gate-signal-carrying (GSC) conductor in a first layer of metallization (M_1st layer) that is over the transistor layer, the first GSC conductor being correspondingly over and electrically coupled with the VG structures, and being over the CSD conductors and the gate conductors, as well as over the active area; and
wherein:
long axes correspondingly of the active area and the first GSC conductor extend substantially in a first direction; and
long axes correspondingly of the CSD conductors and the gate conductors extend substantially in a second direction, the second direction being substantially perpendicular to the first direction.

17. The semiconductor device of claim 16, further comprising:
first via structures in a first layer of interconnection (VIA_1st layer), and correspondingly over the first GSC conductor;
second GSC conductors in a second layer of metallization (M_2nd layer), and correspondingly over the first via structures, as well as correspondingly over the first GSC conductor; and
long axes correspondingly of the second GSC conductors extend substantially in the second direction.

18. The semiconductor device of claim 17, wherein:
relative to the first direction, at least some of the gate conductors are overlapped by corresponding ones of the second GSC conductors.

19. The semiconductor device of claim 17, wherein:
second via structures in a second layer of interconnection (VIA_2nd layer), and correspondingly over the second GSC conductors, as well as correspondingly over the first via structures;
a third GSC conductor in a third layer of metallization (M_3rd layer), and over the second via structures, as well as correspondingly over the first GSC conductor; and
a long axis of the third GSC conductor extends substantially in the first direction.

20. The semiconductor device of claim 16, wherein:
the semiconductor device is included in a serializer/deserializer (SERDES) device.

* * * * *